United States Patent [19]
Yamamoto et al.

[11] Patent Number: 5,677,372
[45] Date of Patent: Oct. 14, 1997

[54] DIAMOND REINFORCED COMPOSITE MATERIAL

[75] Inventors: Yoshiyuki Yamamoto; Takahiro Imai; Takashi Tsuno; Naoji Fujimori, all of Hyogo, Japan

[73] Assignee: Sumitomo Electric Industries, Ltd., Osaka, Japan

[21] Appl. No.: 569,591

[22] Filed: Dec. 8, 1995

Related U.S. Application Data

[63] Continuation-in-part of Ser. No. 221,407, Mar. 31, 1994, abandoned.

[30] Foreign Application Priority Data

Apr. 6, 1993 [JP] Japan ................... 5-079611

[51] Int. Cl.$^6$ ............... C08K 3/04; C23C 16/38; B32B 5/00
[52] U.S. Cl. ............... 524/495; 524/496; 523/204; 523/207; 523/215; 523/222; 428/375; 428/378; 428/380; 428/400; 428/408; 428/607; 427/122; 427/249
[58] Field of Search ................... 524/495, 496; 523/204, 207, 215, 222; 428/378, 380, 400, 607, 375, 408; 427/249, 122

[56] References Cited

U.S. PATENT DOCUMENTS

| Re. 22,373 | 9/1943 | Benner et al. | 428/614 |
|---|---|---|---|
| 2,427,565 | 9/1947 | Liger | 428/609 |
| 3,778,261 | 12/1973 | Nicholas et al. | 419/11 |
| 3,826,630 | 7/1974 | Roy | 428/634 |
| 4,268,276 | 5/1981 | Bovenkerk | 264/332 |
| 4,402,993 | 9/1983 | Aisenberg et al. | 427/527 |
| 4,806,704 | 2/1989 | Belke, Jr. et al. | 174/52.4 |
| 4,957,591 | 9/1990 | Sato et al. | 216/67 |
| 4,960,643 | 10/1990 | Lemelson | 428/408 |
| 5,045,972 | 9/1991 | Supan et al. | 428/408 |
| 5,087,435 | 2/1992 | Potter et al. | 423/446 |
| 5,098,610 | 3/1992 | Okamura et al. | 524/495 |
| 5,187,021 | 2/1993 | Vydra et al. | 428/607 |
| 5,209,916 | 5/1993 | Gruen | 423/446 |
| 5,227,237 | 7/1993 | Saruyama et al. | 428/367 |
| 5,266,236 | 11/1993 | Bovenkerk | 252/503 |

(List continued on next page.)

FOREIGN PATENT DOCUMENTS

| 683453 | 3/1964 | Canada. |
|---|---|---|
| 0378378 | 7/1990 | European Pat. Off.. |
| 0493351 | 7/1992 | European Pat. Off.. |

(List continued on next page.)

OTHER PUBLICATIONS

Fracture Resistance of Diamond–Reinforced Hot Pressed Cu/Ni Powders by Z. Lin et al. Powder Metallurgy Int. vol. 18, No. 2, 1986, pp. 76 to 78.

Article Entitled: "Investigation of the Wetting of Diamond and Graphite by Molten Metals aand Alloys" by Y. V. Naidich et al.; Institute of Materials Problems . . . ; pp. 23–28, May–Jun., 1964.

*Primary Examiner*—Paul R. Michl
*Assistant Examiner*—Olga Asinovsky
*Attorney, Agent, or Firm*—W. G. Fasse; W. F. Fasse

[57] ABSTRACT

An improved adhesion or bonding between diamond fibers and a matrix of at least one organic polymer such as a resin is achieved in a composite material reinforced with vapor-deposited diamond. To improve bonding to the matrix, hydrogen is removed from the surface of vapor-deposited diamond fiber. This can be achieved by heating the diamond under an oxidative atmosphere at a temperature of about 150° C. to about 800° C., or under a non-oxidative atmosphere at a temperature of about 800° C. to about 1500° C. The surface of the vapor-deposited diamond, which contains not more than about $1\times10^{15}/cm^2$ of hydrogen atoms, is bonded to the matrix of resin for example with sufficient strength. To further improve bonding, diamond doped with B or N is employed as the reinforcing material or at least a surface layer thereof.

23 Claims, 1 Drawing Sheet

U.S. PATENT DOCUMENTS

| | | | |
|---|---|---|---|
| 5,277,989 | 1/1994 | Aghajanian et al. | 428/545 |
| 5,304,424 | 4/1994 | Herb et al. | 428/403 |
| 5,336,558 | 8/1994 | Debe | 428/323 |
| 5,385,762 | 1/1995 | Prins | 427/526 |
| 5,415,674 | 5/1995 | Feistritzer et al. | 427/249 |
| 5,431,968 | 7/1995 | Miller et al. | 427/577 |
| 5,591,484 | 1/1997 | Poncelet et al. | 427/249 |

FOREIGN PATENT DOCUMENTS

| | | |
|---|---|---|
| 0493351A2 | 7/1992 | European Pat. Off. . |
| 2499062 | 8/1982 | France . |
| 58-135117 | 8/1983 | Japan . |
| 59-137396 | 8/1984 | Japan . |
| 60-043461 | 3/1985 | Japan . |
| 60-200896 | 10/1985 | Japan . |
| 1-246116 | 10/1989 | Japan . |
| 2-015977 | 1/1990 | Japan . |
| 2-239192 | 9/1990 | Japan . |
| 8406536 | 2/1985 | South Africa . |
| 549935 | 7/1983 | U.S.S.R. . |
| 1374513 | 11/1974 | United Kingdom . |

FIG. 1

DIAMOND REINFORCED COMPOSITE MATERIAL

CROSS REFERENCE TO RELATED APPLICATION

This application is a Continuation-In-Part application of our U.S. Ser. No. 08/221,407, filed on Mar. 31, 1994, now abandoned.

BACKGROUND OF THE INVENTION

1. Field of the Invention

The present invention relates to a diamond reinforced composite material for forming a component which must have a lightweight, high elasticity, high strength and high heat resistance for use in an aircraft, an engine, an acoustic product or sporting goods, and a method of preparing the same.

2. Description of the Background Art

In general, a component which must have a lightweight, high elasticity, high strength or high heat resistance in relation to an aircraft, an engine, an acoustic product or sporting goods is generally made of an aluminum alloy such as duralumin, or a fiber reinforced composite material such as a carbon fiber reinforced composite material. Well-known examples of the fiber reinforced composite material are carbon fiber reinforced resin (CFRP), a carbon fiber reinforced metal prepared by dispersing carbon fiber in a metal, and various ceramics fiber reinforced composite materials prepared by dispersing SiC fiber, glass fiber, SiC whisker, glass whisker and the like in metals or plastic materials. The fiber reinforced composite materials having high strength have been increasingly employed in recent years since they are lighter than an aluminum alloy such as duralumin.

On the other hand, there have recently been proposed techniques of obtaining fibrous, needle-shaped or whiskery vapor-deposited diamond from a raw material of a mixed gas of hydrogen and hydrocarbon. For example, Japanese Patent Laying-Open No. 60-200896 (1985) discloses a technique of depositing fibrous diamond on a surface of a substrate containing transition metal particles of not more than 1000 Å in size adhering thereto from a raw material gas which is excited and decomposed under decompression. Japanese Patent Laying-Open No. 1-246116 (1989) discloses a technique of obtaining needle-shaped, fibrous or porous diamond by exposing a vapor-deposited diamond film to plasma containing oxygen, carbon dioxide, water steam, hydrogen, halogenated hydrocarbon or halogenated carbon, or heat treating the film in an air current containing oxygen, carbon dioxide or water steam. Japanese Patent Laying-Open No. 2-239192 (1990) discloses a technique of etching a vapor-deposited crude diamond film for converting the same to a needle-shaped diamond film and depositing pure diamond on the needle-shaped diamond film. Japanese Patent Laying-Open No. 1-246116 (1989) suggests that a diamond reinforced composite material having an excellent mechanical, thermal or chemical property such as high strength, high wear resistance, high heat conductivity or high corrosion resistance may be prepared by combining needle-shaped, fibrous or porous diamond with another matrix material.

In general, important technical subjects regarding the preparation of a fiber reinforced composite material the adhesion and bondability between the materials to be combined with each other, i.e., a matrix and a reinforcing fiber material. Diamond has the maximum hardness and the maximum modulus of elasticity among materials. Since fibrous diamond is superior in hardness and modulus of elasticity to a reinforcing fiber material of carbon, SiC or glass, it is expected that a composite material reinforced with the fibrous diamond may attain higher strength than those reinforced with other fibrous materials. However, vapor-deposited diamond is inferior in adhesion and bondability with respect to another material such as a metal or plastic, and hence it is difficult to obtain a strongly bonded state by dispersing fibrous diamond in a matrix. Further, diamond is generally inferior in wettability with respect to another material such as a metal or plastic. Therefore, the range of raw materials that can be used as a matrix is restricted in relation to a diamond reinforced composite material, due to the insufficiency of materials having excellent adhesion and bondability with respect to vapor-deposited diamond.

SUMMARY OF THE INVENTION

An object of the present invention is to improve the adhesion or bonding between vapor-deposited diamond and a matrix in a diamond reinforced composite material.

Another object of the present invention is to widen the range of materials that can be used as a matrix in relation to a diamond reinforced composite material.

The present invention provides a composite material reinforced with vapor-deposited diamond. In this composite material, the surface of the diamond is modified to be improved in bondability to the matrix.

A composite material according to an aspect of the present invention comprises a matrix and a reinforcing material, consisting essentially of vapor-deposited diamond, dispersed in the matrix. In this composite material, the amount or density of hydrogen atoms present in a portion corresponding to an interface between the vapor-deposited diamond and the matrix is not more than about $1 \times 10^{15}/cm^2$.

A composite material according to another aspect of the present invention comprises a matrix and a reinforcing material, mainly composed of vapor-deposited diamond dispersed in the matrix. The reinforcing material has a layer which is more strongly bonded to the matrix as compared with the diamond itself at least in a boundary portion between the same and the matrix, so that this layer further reinforces the bonding between the diamond and the matrix as compared with the case without such a layer.

Another aspect of the present invention, provides a method of preparing a diamond reinforced composite material comprising a step of providing vapor-deposited diamond serving as a reinforcing material, a step of removing hydrogen from the surface of the vapor-deposited diamond, and a step of mixing the vapor-deposited diamond with a matrix material for forming a composite material.

A further aspect of the present invention, provides a method of preparing a diamond reinforced composite material, comprising a step of preparing a reinforcing material, mainly composed of vapor-deposited diamond, having a layer at least on its surface which can be more strongly bonded to a matrix material as compared with the diamond, and a step of mixing the reinforcing material with the matrix material for forming a composite material.

According to the present invention, the reinforcing material can consist essentially of at least one vapor-deposited diamond selected from the group of needle-shaped diamond, diamond fiber, diamond whisker and porous diamond, and combinations thereof.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
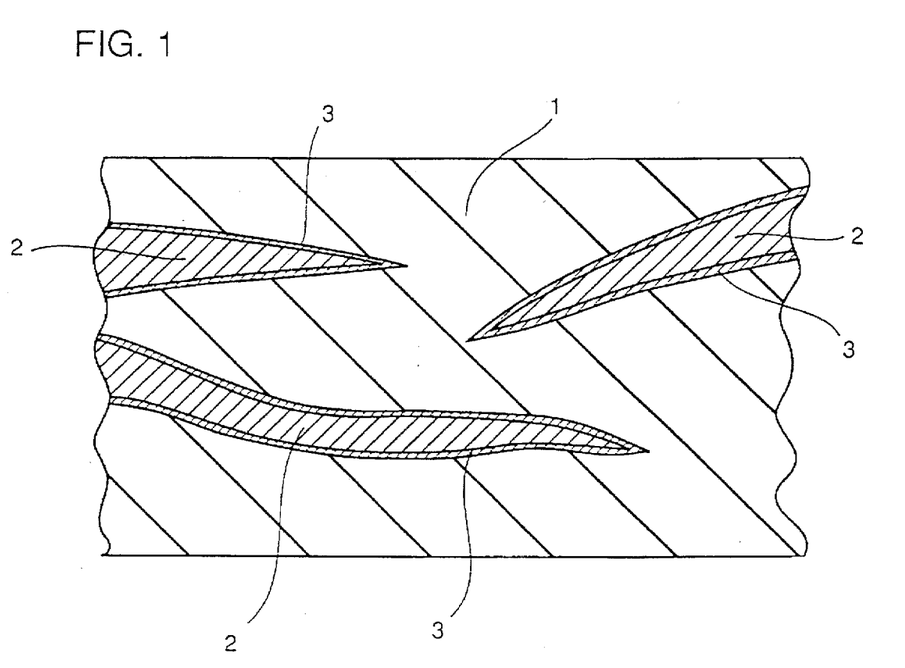
FIG. 1 is a sectional view of a typical, exemplary composite material according to the present invention. Reinforcing materials 2 consisting essentially of diamond are dispersed in a matrix 1. The reinforcing materials 2 are provided on surfaces thereof with intermediate layers 3 for improving bonding between the matrix 1 and the diamond of reinforcing materials 2.

In a preferred mode of the present invention, hydrogen is removed from the surface of vapor-deposited diamond serving as a reinforcing material. The inventors have investigated the cause for of insufficient bonding strength between vapor-deposited diamond and a matrix, and have found that hydrogen which is bonded to the surface of the diamond during the vapor deposition process inhibits bonding between the matrix and the diamond. When the matrix is prepared from a metal, for example, a fragile metal hydrogen compound is formed by such hydrogen on an interface between the matrix and the diamond. This compound reduces bonding between the diamond and the metal. When the reinforcing material is prepared from vapor-deposited diamond, therefore, it is important to remove hydrogen which is bonded to its surface. Also when the matrix is prepared from resin, removal of hydrogen achieves stronger bonding between the diamond and the resin. According to the present invention, the amount of hydrogen atoms bonded onto the diamond surface is reduced to not more than about $1 \times 10^{15}/cm^2$. In practice, the amount of hydrogen atoms which are present on a diamond surface is about $1.5 \times 10^{13}/cm^2$ to about $1 \times 10^{15}/cm^2$, preferably about $1.5 \times 10^{13}/cm^2$ to about $2 \times 10^{14}/cm^2$, for example. Particularly when the matrix is prepared from a metal or an organic polymer, the surface of vapor-deposited diamond containing not more than about $1 \times 10^{15}/cm^2$ of hydrogen atoms is bonded to the matrix with sufficient strength, to provide a diamond reinforced composite material.

According to the present invention, the step of removing hydrogen from the surface of vapor-deposited diamond may include a step of heat treating the diamond under an oxidative atmosphere at a temperature of about 150° C. to about 800° C. The oxidative atmosphere can be prepared from air or an atmosphere containing oxygen in an amount identical to or exceeding that of air. Under such an oxidative atmosphere, it is impossible to remove hydrogen which is bonded to carbon atoms forming the vapor-deposited diamond sufficiently effectively at a temperature of less than 150° C. When the temperature exceeds 800° C., on the other hand, the diamond may be strongly corroded under the oxidative atmosphere.

In another mode of the present invention, it is possible to heat vapor-deposited diamond under a non-oxidative atmosphere at a temperature of about 800° C. to about 1500° C., in order to remove hydrogen from the surface of the diamond. The non-oxidative atmosphere can be an inert gas or a vacuum, for example. Under the non-oxidative atmosphere, a temperature of less than 800° C. is insufficient for uncoupling hydrogen from carbon atoms. When the temperature exceeds 1500° C., on the other hand, the diamond may be corroded even in the non-oxidative atmosphere.

In still another mode of the present invention, the step of removing hydrogen from the surface of vapor-deposited diamond can include a step of exposing the diamond to a plasma containing oxygen. In this case, it is possible to uncouple hydrogen bonded onto the diamond surface at room temperature.

According to another preferred aspect of the present invention, it is possible to form a layer consisting essentially of a material other than diamond or doped diamond at least on a surface of vapor-deposited diamond for improving the bonding strength between the diamond and a matrix through this layer. This intermediate layer is strongly bonded to both the diamond and the matrix. In a preferred mode, the intermediate layer is a coating covering the surface of the diamond, and this coating consists essentially of at least one material selected from the group consisting of Al, Si, B, Ti, V, Cr, Mn, Fe, Co, Ni, Zr, Nb, Mo, Hf, Ta and W, and alloys thereof, a carbide, a nitride and a boride thereof, and combinations thereof. Such a coating can be formed by a CVD or PVD technique. For example, it is possible to heat diamond to a temperature of about 1000° C. to about 1500° C. and expose it to a gas containing Si, thereby forming an SiC layer on its surface. SiC, which can adhere to a metal such as Al, resin or ceramics with sufficient strength, improves the bonding between the diamond and the matrix.

In another preferred mode, the intermediate layer can consist essentially of graphite. Such a graphite layer can be formed by heating the surface of the diamond, for example. Heating vapor-deposited diamond under a non-oxidative atmosphere at a temperature of about 1000° C. to about 1500° C. can convert the surface of the diamond to a graphite carbon layer. In this case the, formation of graphite will not progress much at a temperature of less than 1000° C., while the overall diamond may disadvantageously be converted to graphite if the temperature exceeds 1500° C.

In still another preferred mode, the intermediate layer or the reinforcing material itself can consist essentially of vapor-deposited diamond doped with boron (B), nitrogen (N) or a combination thereof. B and N can be doped into diamond in large amounts without damaging the mechanical properties of the diamond, to improve the surface of the diamond in bonding to she matrix. B and N are suitable as impurities for the reasons that they can be doped in considerable amounts and that the coping vill not deteriorate the mechanical properties of the diamond. Further, B and N can be easily introduced into the diamond as impurities during vapor deposition of the diamond. B or N doped diamond can be vapor-deposited in accordance with a conventional technique, such as that disclosed in Japanese Patent Laying-Open No. 58-135117 (1983) or 59-137396 (1984), for example. The concentration of B, N or a combination thereof contained in the diamond is preferably in a range of about 50 ppm to about 20000 ppm. Diamond doped with less than 50 ppm of such an impurity has an insufficiently improved bondability to the matrix. If the impurity concentration exceeds 20000 ppm, on the other hand, the doped diamond is reduced in strength. In order to introduce a large amount of impurity into the diamond without reducing the strength of the diamond itself, it is more preferable to simultaneously and homogeneously dope the diamond with B and N at a mole weight ratio of 1:1. A process of forming a diamond reinforcing material which is coated with such doped diamond can comprise steps of forming diamond by vapor deposition, and vapor-depositing a diamond layer on the diamond while doping the same with B, N or a combination thereof.

It should be further understood that several features of the invention described individually herein can be combined and are achieved together in a single embodiment. For example, an important embodiment of the present invention is one in which the reinforcing material includes diamond doped with B and/or N, and a surface layer of the reinforcing material has a reduced hydrogen concentration of not more than about $1\times10^{15}$ atoms/cm$^2$, according to the above discussion of the first preferred aspect of the invention.

Further according to the present invention, the matrix can be prepared from at least one material selected from the group consisting of a metal, a semi-metal, ceramics and an organic polymer such as resin, and combinations thereof. The metal or the semi-metal for the matrix can be selected from the group consisting of Al, Mg, Ti, Si, Be, Zr, Ni, Co, Fe, Cr, and alloys thereof. Each alloy preferably contains at least 20% of any metal. The matrix metal is mixed with diamond having a modified surface, and the mixture as formed is subjected to deformation processing such as rolling or extrusion, to form a sheet-type or linear diamond reinforced metal. In this case, she content of the diamond occupying the raw material mixture is preferably not more than about 60 percent by volume, and more preferably about 5 percent by volume to about 50 percent by volume. If an amount of the diamond component greater than 60 percent is contained in the raw material then the, strength of the diamond reinforced metal is reduced. On on the other hand, the matrix consist essentially of a compound selected from the group consisting of a carbide, a nitride, a boride and an oxide of Al, Mg, Si, B, Ti, V, Zr, Nb, Mo, Hf, Ta and W, and combinations thereof. For example, ceramics used as the matrix may include $Si_3N_4$, SiC, zirconia, alumina, mullite or the like. Ceramics material such as SiC or $Si_3N_4$ is mixed with the diamond having a modified surface so that the mixture as formed is then molded and sintered to provide diamond reinforced ceramics. When the matrix is prepared from an organic polymer, the diamond can be combined with thermoplastic resin or thermosetting resin. Examples of the thermoplastic resin are addition polymerization polyethylene, polypropylene, polyvinyl chloride, polystyrene, polyvinylidene chloride, fluororesin, polymethyl methacrylate, polycondensation polyamide, polyester, polycarbonate, polyphenylene oxide, polyaddition thermoplastic polyurethane and ring-opening polymerization polyacetal. The mixture of the thermoplastic resin and the diamond having a modified surface may be molded by ordinary injection molding, to a composite material. On the other hand, examples of the thermosetting resin are urea resin, melamine resin and phenol resin. When the matrix is prepared from such thermosetting resin, it is possible to prepare a composite material by mixing a liquid type matrix with diamond having a modified surface, and heating the mixture for hardening the same. Other materials such as polyimide, polyphenylene sulfide, polyether sulfone, polyetherketone, polyimide, epoxy resin and the like may be used as the resin matrix.

When the surface of diamond is reformed in accordance with the present invention, bonding between the diamond and the matrix material is remarkably improved. This enables the production of a composite material not only having excellent mechanical strength but also having a large area or a long size. If vapor-deposited diamond without a modified surface is mixed with a matrix then composite material as obtained has inferior strength and it is difficult to obtain a composite material having a large area or a long size. The composite material according to the present invention has excellent wear resistance, heat conductivity, heat resistance, corrosion resistance and radiation resistance, and high mechanical strength. The composite material according to the present invention can be applied to a wider range of users and under more severe conditions as compared with the prior art. For example, the composite material according to the present invention can provide a sliding material with a longer life than that of the prior art, due to its excellent wear resistance. Further, the composite material according to the present invention, which is resistant to radiation, can be employed for forming the airframe of a spacecraft. In addition, the present invention widens the range of materials employable as a matrix by improving the bondability of diamond to the matrix.

Examples of the present invention will now be described in detail.

EXAMPLE 1

According to the technique disclosed by Japanese Patent Laying-Open No. 1-246116 (1989), diamond as a reinforcing material was prepared as follows.

A diamond film of about 100 μm thickness was deposited on a silicon substrate by microwave plasma CVD. CVD conditions were as follows:

Raw Material: mixed gas 3% of methane and hydrogen

Pressure: 40 Torr

Substrate Temperature: 850° C.

The diamond film as obtained was exposed to a hydrogen at a pressure of 80 Torr in a plasma etching apparatus at a temperature of 980° C. for about 20 minutes. The silicon substrate was dissolved with a dilute mixed solution of hydrofluoric acid and nitric acid, to separate the treated film from the substrate. As a result, the diamond film, which was cracked by the plasma treatment, was finely decomposed, to provide needle-shaped and fibrous diamonds (hereinafter referred to as diamond fiber) having an average length of about 100 μm and an average diameter of about 5 μm.

About 2 g of the diamond fiber as obtained was introduced into a reaction chamber, and held in the air at 500° C. for about 1 hour. Thus, hydrogen was removed from the surface of the diamond. Since it was difficult to directly measure the amount of hydrogen remaining on the surface of the diamond fiber, the following experiment was carried out. A diamond film obtained on a single-crystal diamond substrate under the above conditions was introduced into the reaction chamber, and held in the air at 500° C. for about 1 hour. The amount of hydrogen atoms on the diamond film surface was then measured by elastic recoil detection (ERD), and the value of $9.6\times10^{13}$/cm$^2$ was obtained as the amount of hydrogen atoms. This result suggests that about $9.6\times10^{13}$/cm$^2$ of hydrogen atoms remain on the surface of the diamond fiber as well. 2 g of the diamond fiber whose surface was reformed in the aforementioned manner was mixed with 20 g of a commercially available polyethylene pellet, and the mixture was heated in the atmosphere to 400° C. and injection-molded, to prepare diamond reinforced polyethylene resin. A sample A was prepared from the diamond reinforced resin as obtained, and subjected to measurements of the modulus of elasticity and tensile strength. Table 1 shows the results.

EXAMPLE 2

About 2 g of the diamond fiber obtained in Example 1 was introduced into a reaction chamber, and held in a vacuum of $10^{-4}$ Torr at 1200° C. for 1 hour. An analysis by surface sensitization Raman spectroscopy resulted in a value of 0.91 as a peak ratio (Y/X) of the graphite carbon peak value (Y) relative to the diamond carbon peak value (X). As a result, it was confirmed that graphite was formed on the diamond surface. 2 g of the diamond fiber whose surface was reformed in the aforementioned manner was mixed with 20 g of a commercially available polyethylene pellet, and the mixture was heated in the atmosphere to 400° C. and injection-molded, to prepare diamond reinforced polyethylene resin. A sample B was prepared from the composite material as obtained, and subjected to measurements of the modulus of elasticity and tensile strength. Table 1 shows the results.

EXAMPLE 3

About 2 g of the diamond fiber obtained in Example 1 was introduced into a reaction chamber, and exposed to a water steam atmosphere of 0.2 Torr, to which a high-frequency discharge of 80 W was applied, at temperature for 10 minutes. Thus, hydrogen was removed from the surface of the diamond. 2 g of the diamond fiber whose surface was reformed in the aforementioned manner was mixed with 20 g of a commercially available polyethylene pellet, and the mixture was heated in the atmosphere to 400° C. and injection-molded, to prepare diamond reinforced polyethylene resin. A sample C was prepared from the composite material as obtained, and subjected to measurements of the modulus of elasticity and tensile strength. Table 1 shows the results.

EXAMPLE 4

The surface of the diamond fiber obtained in Example 1 was coated with Ti in a thickness of about 0.02 µm by well-known sputtering. 2 g of the diamond fiber having the Ti layer on its surface was mixed with 20 g of a commercially available polyethylene pellet, and the mixture was heated in the atmosphere to 400° C. and injection-molded, to prepare diamond reinforced polyethylene resin. A sample D was prepared from the composite material as obtained, and subjected to measurements of the modulus of elasticity and tensile strength. Table 1 shows the results.

Comparative Example 1

About 2 g of the diamond fiber obtained in Example 1 was introduced into a reaction chamber, and exposed to a hydrogen atmosphere of 5 Torr, to which a microwave discharge of 150 W was applied, at room temperature for about 30 minutes. On the other hand, the diamond film on the single-crystal diamond substrate as obtained in Example 1 was introduced into the reaction chamber, and exposed to a hydrogen atmosphere of 5 Torr, to which a microwave discharge of 150 W was applied at room temperature for about 30 minutes. The amount of hydrogen atoms on the diamond film surface was then measured by ERD, and the value of $2.4 \times 10^{15}/cm^2$ was obtained. This result suggests that at least $2.4 \times 10^{15}/cm^2$ of hydrogen atoms existed on the surface of the diamond fiber. 2 g of the diamond fiber as treated was mixed with 20 g of a commercially available polyethylene pellet, and the mixture was heated in the atmosphere to 400° C. and injection-molded, to prepare diamond reinforced polyethylene resin. A sample E was prepared from the composite material as obtained, and subjected to measurements of the modulus of elasticity and tensile strength. Table 1 shows the results.

Comparative Example 2

The diamond fiber obtained in Example 1 was employed directly for forming a composite material with no treatment on its surface. 2 g of the diamond fiber was mixed with 20 g of a commercially available polyethylene pellet, and the mixture was heated in the atmosphere to 400° C. and injection-molded, to prepare diamond reinforced polyethylene resin. A sample F was prepared from the composite material as obtained, and subjected to measurements of the modulus of elasticity and tensile strength. Table 1 shows the results.

TABLE 1

| Sample | Modulus of Elasticity (GPa) | Tensile Strength (Mpa) |
| --- | --- | --- |
| A | 105 | 360 |
| B | 125 | 420 |
| C | 110 | 450 |
| D | 120 | 510 |
| E | 90 | 80 |
| F | 94 | 150 |

The results shown in Table 1, confirm that each diamond reinforced polyethylene resin according to the present invention was improved in both the modulus of elasticity and the tensile strength as compared with each comparative example.

EXAMPLE 5

A diamond film about 150 µm in thickness was deposited on a silicon substrate by microwave plasma CVD. CVD conditions were as follows:

Raw Material: mixed gas of 3% methane and hydrogen

Pressure: 40 Torr

Substrate Temperature: 850° C.

The diamond film as obtained was exposed to a hydrogen plasma at a pressure of 80 Torr in a plasma etching apparatus at a temperature of 980° C. for about 20 minutes. The silicon substrate was dissolved with a dilute mixed solution of hydrofluoric acid and nitric acid, to separate the treated film from the substrate. As a result, the diamond film, which was cracked by the plasma etching, was finely decomposed, to provide needle-shaped and fibrous diamonds (hereinafter referred to as diamond fiber) having an average length of about 150 µm and an average diameter of about 8 µm.

Si was deposited on the surface of the diamond fiber as obtained in a thickness of about 0.03 µm by well-known sputtering. Then, 3 g of the diamond fiber coated with Si was mixed with 30 g of Al powder in which 8 percent by weight of Si was solidly dissolved, and the mixture was sintered at 400° C. to prepare a diamond reinforced aluminum alloy. A sample G was prepared from the composite material as obtained, and subjected to measurements of the modulus of elasticity and tensile strength. Table 2 shows the results.

EXAMPLE 6

The diamond fiber obtained in Example 5 was introduced into a reaction chamber, and exposed to a gas, which was prepared by mixing 0.5 percent by volume of $SiH_4$ into $H_2$ gas under a reaction chamber pressure of 60 Torr at a temperature of 1250° C. at a gas flow rate of 1000 sccm for 1 hour. This step formed an SiC layer on the surface of the diamond fiber. Conversion of the diamond fiber surface to SiC was confirmed by X-ray photoelectron spectroscopy. Then, 3 g of the diamond fiber having SiC on its surface was mixed with 30 g of Al powder in which 8 percent by weight of Si was solidly dissolved, and the mixture was sintered at 400° C. to prepare a diamond reinforced aluminum alloy. A sample H was prepared from the composite material as obtained, and subjected to measurements of the modulus of elasticity and tensile strength. Table 2 shows the results.

Comparative Example 3

3 g of the diamond fiber obtained in Example 5 was mixed as such with 30 g of Al powder in which 8 percent by weight of Si was solidly dissolved, and the mixture was sintered at 400° C. to prepare a diamond reinforced aluminum alloy. A sample I was prepared from the composite material as obtained, and subjected to measurements of the modulus of elasticity and tensile strength. Table 2 shows the results.

EXAMPLE 7

A diamond film about 120 μm in thickness which was doped with B and N was deposited on a silicon substrate by microwave plasma CVD. CVD conditions were as follows:

Raw Material: mixed gas of 4 percent by volume of $CH_4$ gas, 0.5 percent by volume of $N_2$ gas, 0.01 percent by volume of $B_2H_6$ gas and the remainder of $H_2$ gas Pressure: 40 Torr Substrate Temperature: 850° C.

The diamond film as obtained was exposed to a hydrogen plasma at a pressure of 80 Torr in a plasma etching apparatus at a temperature of 980° C. for about 20 minutes. The silicon substrate was dissolved with a dilute mixed solution of hydrofluoric acid and nitric acid, to separate the treated film from the substrate. As a result, the diamond film was finely decomposed, to provide needle-shaped and fibrous diamonds containing impurities (hereinafter referred to as doped diamond fiber) having an average length of about 120 μm and an average diameter of about 10 μm.

The obtained diamond fiber contained about 150 ppm of B and about 220 ppm of N as impurities. Then, 3 g of the doped diamond fiber was mixed with 30 g of Al powder in which 8 percent by weight of Si was solidly dissolved, and the mixture as obtained was sintered at 400° C., to prepare a diamond reinforced aluminum alloy. A sample J was prepared from the composite material as obtained, and subjected to measurements of the modulus of elasticity and tensile strength. Table 2 shows the results.

TABLE 2

| Sample | Modulus of Elasticity (GPa) | Tensile Strength (Mpa) |
| --- | --- | --- |
| G | 320 | 670 |
| H | 390 | 550 |
| I | 260 | 100 |
| J | 300 | 480 |

The results shown in Table 2, confirm that each diamond reinforced aluminum alloy according to the present invention was improved in both the modulus of elasticity and the tensile strength as compared with the comparative example.

EXAMPLE 8

A diamond film about 60 μm in thickness was deposited on a silicon substrate by microwave plasma CVD. CVD conditions were as follows:

Raw Material: mixed gas of 3% methane and hydrogen

Pressure: 40 Torr

Substrate Temperature: 850° C.

The diamond film as obtained was exposed to a hydrogen plasma at a pressure of 80 Torr in a plasma etching apparatus at a temperature of 980° C. for about 20 minutes. The silicon substrate was dissolved with a dilute mixed solution of hydrofluoric acid and nitric acid, to separate the treated film from the substrate. As a result, the diamond film was finely separated, to provide needle-shaped and fibrous diamonds (hereinafter referred to as diamond fiber) having an average length of about 60 μm and an average diameter of about 4 μm.

Then, an SiC layer was formed on the surface of the diamond fiber, similarly to Example 6. Then, 5 g of the diamond fiber having an SiC layer on its surface was mixed with 25 g of $Si_3N_4$ powder and 1 g of $Y_2O_3$ powder, and the mixture was sintered at 1350° C. to prepare diamond reinforced silicon nitride ceramics. A sample K was prepared from the composite material as obtained, and subjected to measurements of the modulus of elasticity and bending strength. Table 3 shows the results.

Comparative Example 4

The diamond fiber obtained in Example 8 with no surface treatment was used directly to make a composite material. 5 g of the diamond fiber was mixed with 25 g of $Si_3N_4$ powder and 1 g of $Y_2O_3$ powder, and the mixture as obtained was sintered at 1350° C., to prepare diamond reinforced silicon nitride ceramics. A sample L was prepared from the composite material as obtained, and subjected to measurements of the modulus of elasticity and bending strength. Table 3 shows the results.

TABLE 3

| Sample | Modulus of Elasticity (GPa) | Bending Strength (Mpa) |
| --- | --- | --- |
| K | 480 | 410 |
| L | 460 | 360 |

The results shown in Table 3, confirm that the diamond reinforced polyethylene resin according to the present invention was improved in both the modulus of elasticity and the bending strength as compared with the comparative example.

EXAMPLE 9

A diamond film about 120 μm in thickness which was doped with B and N was deposited on a silicon substrate by microwave plasma CVD. The CVD conditions were as follows:

Raw material: mixed gas of 4 percent by volume of $CH_4$ gas, 0.5 percent by volume of $N_2$ gas, 0.01 percent by volume of $B_2H_6$ gas and the remainder of $H_2$ gas;

Pressure: 40 Torr; and

Substrate Temperature: 850° C.

The diamond film obtained as explained above was exposed to hydrogen plasma at a pressure of 80 Torr in a plasma etching apparatus at a temperature of 980° C. for about 20 minutes. The silicon substrate was then dissolved with a dilute mixed solution of hydrofluoric acid and nitric acid, to separate the treated film from the substrate. As a result, the diamond film was finely decomposed, to provide needle-shaped and fibrous diamonds containing impurities (hereinafter referred to as doped diamond fiber), having an average length of about 120 μm and an average diameter of about 10 μm.

The obtained diamond fiber contained about 150 ppm of B and 220 ppm of N as impurities. About 2 g of the obtained diamond fiber was introduced into a reaction chamber, and held in the air at 500° C. for about 1 hour. Thus, hydrogen was removed from the surface of the diamond. Since it was difficult to directly measure the amount of hydrogen remaining on the surface of the diamond fiber, the following experiment was carried out. A diamond film formed on a single crystal diamond substrate under the above conditions was introduced into the reaction chamber, and held in the air at 500° C. for about 1 hour. The amount of hydrogen atoms remaining on the diamond film surface was then measured to be $9.1 \times 10^{13}/cm^2$ by the elastic recoil detection (ERD) method. This result suggested that about $9.1 \times 10^{13}/cm^2$ of hydrogen atoms were on the surface of the diamond fiber. 2 g of the diamond fiber with its surface reformed or treated in the aforementioned manner was mixed with 20 g of a commercially available polyethylene pellet, and the mixture was heated in the atmosphere to 400° C. and injection-molded, to prepare diamond reinforced polyethylene resin. A sample M was prepared from the obtained diamond reinforced resin, and its modulus of elasticity and tensile strength were measured. Table 4 shows the results.

TABLE 4

| Sample | Modulus of Elasticity (GPa) | Bending Strength (MPa) |
| --- | --- | --- |
| M | 130 | 390 |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A diamond reinforced composite material comprising:
   a matrix consisting essentially of at least one organic polymer, and
   a reinforcing material that is dispersed in said matrix and that has a core and a surface layer on said core at least at an interface portion between said core and said matrix,
   wherein said core comprises vapor-deposited diamond selected from the group consisting of needle-shaped diamond, diamond fiber, diamond whisker, porous diamond, and combinations thereof,
   wherein at least said surface layer comprises diamond doped with dopant atoms selected from the group consisting of B, N and combinations thereof, and
   wherein said surface layer bonds more strongly to said matrix than does said core itself.

2. The diamond reinforced composite material of claim 1, wherein said doped diamond is included only in said surface layer.

3. The diamond reinforced composite material of claim 1, wherein the total dopant concentration of said dopant atoms is in the range from about 50 ppm to about 20,000 ppm.

4. The diamond reinforced composite material of claim 1, wherein said dopant atoms include B and N with the ratio of B to N being about 1:1.

5. The diamond reinforced composite material of claim 1, wherein said surface layer has a hydrogen concentration of not more than about $1 \times 10^{15}/cm^2$ hydrogen atoms.

6. The diamond reinforced composite material of claim 5, wherein said hydrogen concentration is in the range from about $1.5 \times 10^{13}/cm^2$ to about $1 \times 10^{15}/cm^2$ hydrogen atoms.

7. The diamond reinforced composite material of claim 5, wherein said hydrogen concentration is in the range from about $1.5 \times 10^{13}/cm^2$ to about $2 \times 10^{14}/cm^2$ hydrogen atoms.

8. The diamond reinforced composite material of claim 5, wherein the volume content of said reinforcing material as a portion of the total volume of said composite material is not more than about 60% by volume.

9. The diamond reinforced composite material of claim 5, wherein the volume content of said reinforcing material as a portion of the total volume of said composite material is in the range from about 5% to about 50% by volume.

10. The diamond reinforced composite material of claim 1, wherein the volume content of said reinforcing material as a portion of the total volume of said composite material is not more than about 60% by volume.

11. The diamond reinforced composite material of claim 1, wherein the volume content of said reinforcing material as a portion of the total volume of said composite material is in the range from about 5% to about 50% by volume.

12. The diamond reinforced composite material of claim 1, wherein said organic polymer is a thermoplastic resin.

13. The diamond reinforced composite material of claim 12, wherein said thermoplastic resin comprises at least one material selected from the group consisting of addition polymerization polyethylene, polypropylene, polyvinyl chloride, polystyrene, polyvinylidene chloride, fluororesin, polymethyl methacrylate, polycondensation polyamide, polyester, polycarbonate, polyphenylene oxide, polyaddition thermoplastic polyurethane and ring-opening polymerization polyacetal.

14. The diamond reinforced composite material of claim 1, wherein said organic polymer is a thermosetting resin.

15. The diamond reinforced composite material of claim 14, wherein said thermosetting resin comprises at least one material selected from the group consisting of urea resin, melamine resin and phenol resin.

16. The diamond reinforced composite material of claim 1, wherein said organic polymer comprises at least one material selected from the group consisting of polyimide, polyphenylene sulfide, polyether sulfone, polyetherketone, polyimide and epoxy resin.

17. A diamond reinforced composite material comprising:
   a matrix consisting essentially of at least one organic polymer, and
   a reinforcing material that is dispersed in said matrix and that has a core and a surface layer on said core at least at an interface portion between said core and said matrix,
   wherein said core is composed mainly of vapor-deposited diamond,
   wherein said surface layer consists essentially of graphite, and
   wherein said surface layer bonds more strongly to said matrix than does said core itself.

18. The diamond reinforced composite material of claim 17, wherein said core consists essentially of vapor-deposited diamond selected from the group consisting of needle-shaped diamond, diamond fiber, diamond whisker, porous diamond, and combinations thereof.

19. The diamond reinforced composite material of claim 17, wherein said organic polymer comprises a thermoplastic resin selected from the group consisting of addition polymerization polyethylene, polypropylene, polyvinyl chloride, polystyrene, polyvinylidene chloride, fluororesin, polymethyl methacrylate, polycondensation polyamide, polyester, polycarbonate, polyphenylene oxide, polyaddition thermoplastic polyurethane and ring-opening polymerization polyacetal.

20. The diamond reinforced composite material of claim 17, wherein said organic polymer comprises a thermosetting resin selected from the group consisting of urea resin, melamine resin and phenol resin.

21. The diamond reinforced composite material of claim 1, wherein said core consists essentially of said vapor-deposited diamond, and said surface layer consists essentially of said diamond doped with said dopant atoms.

22. The diamond reinforced composite material of claim 1, wherein said vapor-deposited diamond of said core is doped diamond containing dopant atoms selected from the group consisting of B, N and combinations thereof.

23. The diamond reinforced composite material of claim 5, wherein said vapor-deposited diamond of said core is doped diamond containing dopant atoms selected from the group consisting of B, N and combinations thereof.

* * * * *

UNITED STATES PATENT AND TRADEMARK OFFICE
CERTIFICATE OF CORRECTION

PATENT NO. : 5,677,372
DATED : October 14, 1997
INVENTOR(S) : Yamamoto, et. al.

It is certified that error appears in the above-identified patent and that said Letters Patent is hereby corrected as shown below:

Col. 1, line 64, after "material" insert --are--.
Col. 2, line 48, after "rial" insert --,--.
Col. 4, line 41, replace "she" by --the--;
   line 43, replace "coping vill" by --doping will--.
"Col. 5, line 24, after "material" insert --,--, and before "strength" delete ",".
   line 26, after "matrix" insert --can--;
   line 61, after "matrix" insert --,--, after "then" insert --the--.
Col. 6, line 2, replace "users" by --uses--;
   line 26, after "hydrogen" insert --plasma--.
Col. 7, line 16, after "at" insert --room--.
Col. 9, line 55, delete ",".

Signed and Sealed this

Tenth Day of February, 1998

Attest:

BRUCE LEHMAN

Attesting Officer

Commissioner of Patents and Trademarks